US012658942B2

(12) United States Patent
Huang et al.

(10) Patent No.: US 12,658,942 B2
(45) Date of Patent: Jun. 16, 2026

(54) DECODER SCHEME CAPABLE OF REDUCING FREQUENCY OF MEMORY READING AND WRITING DURING ITERATIVE DECODING PROCEDURE

(71) Applicant: Silicon Motion, Inc., Hsinchu County (TW)

(72) Inventors: Hung-Jen Huang, Taichung City (TW); Mao-Ruei Li, Hsinchu City (TW); Zhen-U Liu, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 32 days.

(21) Appl. No.: 18/959,533

(22) Filed: Nov. 25, 2024

(65) Prior Publication Data

US 2025/0274144 A1     Aug. 28, 2025

(30) Foreign Application Priority Data

Feb. 23, 2024     (TW) ................................. 113106548

(51) Int. Cl.
H03M 13/00     (2006.01)
H03M 13/11     (2006.01)
H03M 13/15     (2006.01)
(52) U.S. Cl.
CPC ...  H03M 13/1575 (2013.01); H03M 13/1125 (2013.01); H03M 13/6566 (2013.01)
(58) Field of Classification Search
CPC ...... H03M 13/11; H03M 13/15; H03M 13/03; H03M 13/00
See application file for complete search history.

(56) References Cited

U.S. PATENT DOCUMENTS

| | | | | |
|---|---|---|---|---|
| 8,543,891 B2 * | 9/2013 | Anholt | ............... | H03M 13/1111 |
| | | | | 714/752 |
| 8,954,822 B2 * | 2/2015 | Frayer | ............... | H03M 13/1102 |
| | | | | 714/763 |
| 8,984,365 B1 * | 3/2015 | Norrie | ............... | H03M 13/1111 |
| | | | | 714/755 |
| 10,523,245 B2 * | 12/2019 | Kumar | ............. | H03M 13/2942 |

(Continued)

FOREIGN PATENT DOCUMENTS

WO          2012/097046 A1     7/2012

*Primary Examiner* — Esaw T Abraham
(74) *Attorney, Agent, or Firm* — Winston Hsu

(57)          ABSTRACT

A decoding method includes: generating a variable-to-check message and a log-likely ratio according a specific codeword; converting the variable-to-check message from variable node domain into check node domain to generate a converted variable-to-check message; generating a check-to-variable message according to the converted variable-to-check message; converting the check-to-variable message from check node domain into variable node domain to generate a converted check-to-variable message; updating the variable-to-check message and the log-likely ratio based on the converted check-to-variable message; performing a hard decision according to the log-likely ratio to determine whether flip bit(s); and, for specific data to be stored into a first memory macro, enabling a write operation of a portion of first physical sub-memories and disabling a write operation of another portion of first physical sub-memories.

18 Claims, 7 Drawing Sheets

(56)                    References Cited

U.S. PATENT DOCUMENTS

| | | | |
|---|---|---|---|
| 11,929,761 B1 * | 3/2024 | Ulriksson | H03M 13/1134 |
| 11,996,862 B2 * | 5/2024 | Ulriksson | G06F 9/546 |
| 2010/0199149 A1 | 8/2010 | Weingarten | |
| 2011/0246862 A1 | 10/2011 | Graef | |
| 2016/0179620 A1 * | 6/2016 | Bazarsky | H03M 13/118 |
| | | | 714/766 |
| 2019/0109601 A1 * | 4/2019 | Owen | H03M 13/1111 |
| 2020/0228144 A1 | 7/2020 | Doubchak | |
| 2021/0288672 A1 | 9/2021 | Smith | |
| 2023/0059393 A1 * | 2/2023 | Jang | H03M 13/1125 |

* cited by examiner

DECODER SCHEME CAPABLE OF REDUCING FREQUENCY OF MEMORY READING AND WRITING DURING ITERATIVE DECODING PROCEDURE

BACKGROUND OF THE INVENTION

1. Field of the Invention

The present invention relates to a decoding scheme, and more particularly to a decoder circuit, a decoding method, and a flash memory controller having the decoder circuit.

2. Description of the Prior Art

Generally speaking, traditional existing technologies are limited by the impact of process yield, and the memory suppliers will limit the depth and bandwidth of the memories. Thus, the actual memory bandwidth often cannot meet the system-level requirements, and all small physical memories will operate at the same time when each time it is necessary to read and write data based on the system-level requirements. However, in a high-noise environment, such as the iterative decoding calculation of a decoder, it quite consumes power to simultaneously read and write all small physical memories each time.

SUMMARY OF THE INVENTION

Therefore one of the objectives of the invention is to provide a decoder circuit, a decoding method, and a flash memory controller, to solve the problems.

According to embodiments of the invention, a decoder circuit is disclosed. The decoder circuit comprises a variable node circuit, a variable-to-check circuit, a check node circuit, a check-to-variable circuit, a syndrome calculation circuit, a first memory macro, and a second memory macro. The variable node circuit is used for receiving a specific codeword of an input data and for generating or updating a variable-to-check message based on data of the specific codeword and generating a log-likely ratio to the syndrome calculation circuit. The variable-to-check circuit, coupled to the variable node circuit, is used for converting the variable-to-check message from a variable node domain to a check node domain to generate a converted variable-to-check message. The check node circuit, coupled to the variable-to-check circuit, is used for performing a minimization calculation based on the converted variable-to-check message to generate a check-to-variable message. The check-to-variable circuit, coupled to the check node circuit, is used for converting the check-to-variable message from the check node domain to the variable node domain to generate a converted check-to-variable message, to make the variable node circuit based on the converted check-to-variable message perform a sum calculation to update the variable-to-check message and perform another sum calculation to update the log-likely ratio. The syndrome calculation circuit, coupled to the variable node circuit, is used for performing a hard decision operation based on the log-likely ratio to determine whether to flip information of at least one bit in the specific codeword to generate an output codeword. The first memory macro has multiple first physical sub-memories, to be read and written and controlled by the check node circuit to perform the minimization calculation. The second memory macro has multiple second physical sub-memories, to be read and written and controlled by the variable node circuit to perform the sum calculation and the another sum calculation. The check node circuit performs a difference value calculation upon specific data to be stored in the first memory macro and a reference data to generate a difference value, activates a write operation of a portion of first physical sub-memories in the multiple first physical sub-memories to write the difference value into the portion of first physical sub-memories in the multiple first physical sub-memories, and closes a write operation of another portion of first physical sub-memories in the multiple first physical sub-memories.

According to the embodiments, a decoding method of a decoder circuit is disclosed. The decoding method comprises: using a variable node circuit to receive a specific codeword of an input data and generate or update a variable-to-check message based on data of the specific codeword and generate a log-likely ratio to a syndrome calculation circuit; converting the variable-to-check message from a variable node domain to a check node domain to generate a converted variable-to-check message; using a check node circuit to perform a minimization calculation based on the converted variable-to-check message to generate a check-to-variable message; converting the check-to-variable message from the check node domain to the variable node domain to generate a converted check-to-variable message; performing a sum calculation to update the variable-to-check message based on the converted check-to-variable message and performing another sum calculation to update the log-likely ratio; performing a hard decision operation based on the log-likely ratio to determine whether to flip information of at least one bit in the specific codeword to generate an output codeword; providing a first memory macro having multiple first physical sub-memories, to be read and written and controlled by the check node circuit to perform the minimization calculation; providing a second memory macro having multiple second physical sub-memories, to be read and written and controlled by the variable node circuit to perform the sum calculation and the another sum calculation; and, performing a difference value calculation upon specific data to be stored in the first memory macro and a reference data to generate a difference value, activating a write operation of a portion of first physical sub-memories in the multiple first physical sub-memories to write the difference value into the portion of first physical sub-memories in the multiple first physical sub-memories, and closing a write operation of another portion of first physical sub-memories in the multiple first physical sub-memories.

According to the embodiments, a flash memory controller is disclosed. The flash memory controller comprises an encoder and a decoder circuit. The encoder is used for performing an encoding operation upon a write data sent from a host device to write the write data into a flash memory. The decoder circuit is used for performing a decoding operation upon a read data read from the flash memory to generate a decoded data. The decoder circuit comprises a variable node circuit, a variable-to-check circuit, a check node circuit, a check-to-variable circuit, a syndrome calculation circuit, a first memory macro, and a second memory macro. The variable node circuit is used for receiving a specific codeword of the read data and for generating or updating a variable-to-check message based on data of the specific codeword and generating a log-likely ratio to the syndrome calculation circuit. The variable-to-check circuit, coupled to the variable node circuit, is used for converting the variable-to-check message from a variable node domain to a check node domain to generate a converted variable-to-check message. The check node circuit, coupled to the variable-to-check circuit, is used for performing a minimization calculation based on the converted variable-to-check message to generate a check-to-variable message. The check-to-variable circuit, coupled to the check node circuit, is used for converting the check-to-variable message from the check node domain to the variable node domain to generate a converted check-to-variable message, to make the variable node circuit based on the converted check-to-variable message perform a sum calculation to update the variable-to-check message and perform another sum calculation to update the log-likely ratio. The syndrome calculation circuit, coupled to the variable node circuit, is used for performing a hard decision operation based on the log-likely ratio to determine whether to flip information of at least one bit in the specific codeword to generate an output codeword. The first memory macro has multiple first physical sub-memories, to be read and written and controlled by the check node circuit to perform the minimization calculation. The second memory macro has multiple second physical sub-memories, to be read and written and controlled by the variable node circuit to perform the sum calculation and the another sum calculation. The check node circuit performs a difference value calculation upon specific data to be stored in the first memory macro and a reference data to generate a difference value, activates a write operation of a portion of first physical sub-memories in the multiple first physical sub-memories to write the difference value into the portion of first physical sub-memories in the multiple first physical sub-memories, and closes a write operation of another portion of first physical sub-memories in the multiple first physical sub-memories.

These and other objectives of the present invention will no doubt become obvious to those of ordinary skill in the art after reading the following detailed description of the preferred embodiment that is illustrated in the various figures and drawings.

DETAILED DESCRIPTION

The present invention aims at providing a decoder circuit that can reduce the frequency of memory reading and writing during an iterative decoding procedure, so as to further reduce power consumption of data reading and writing. When performing read and write control of a memory, the present invention is to change the definition of a system bandwidth into the bandwidth of each physical memory, to divide or cut a data width of the data into several blocks having the sizes being equal to the size of the physical memory, and to determine whether one/each divided block is matched to a specific read-write condition to reduce the number/frequency of reading and writing for the block, so as to reduce the power consumption of data reading and writing for the entire memory. Specifically, during the procedure of the iterative decoding, the present invention is to record the writing behavior/operation of each physical memory at different addresses. If a physical memory has never been written at a specific address, the system directly skips the read/write of the physical memory when the system is needed to perform a read operation for the specific address, and directly sets/configures the corresponding read value as a default value such as bit '0' (but not limited).

Figure 1:
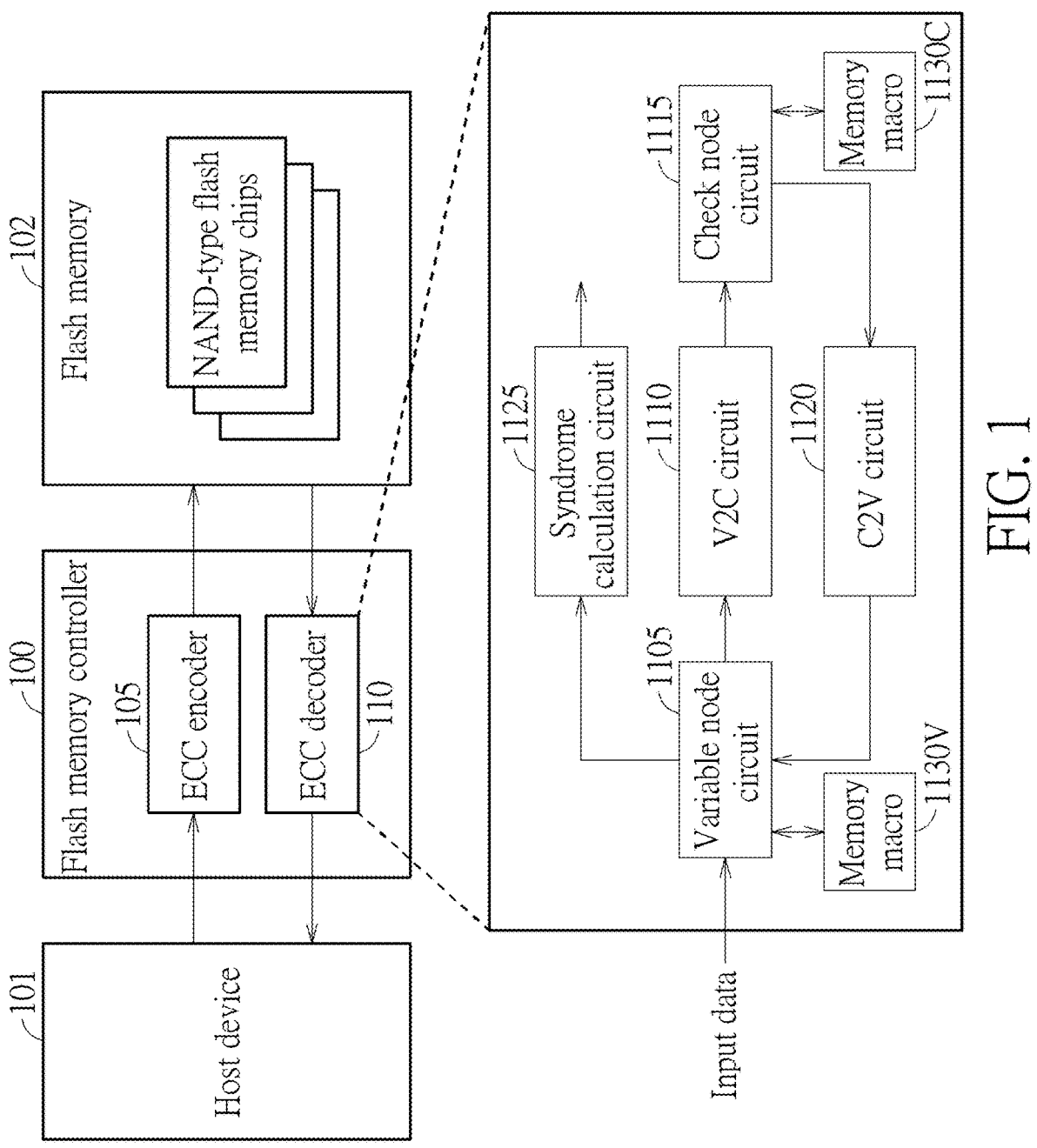
FIG. 1 is a block diagram of a flash memory controller according to an embodiment of the present invention.

Refer to FIG. 1. FIG. 1 is a block diagram of a flash memory controller 100 according to an embodiment of the invention. As shown in FIG. 1, the flash memory controller 100 is coupled between a host device 101 and a flash memory 102. The flash memory controller 100 includes an encoder 105 and a decoder circuit 110. The encoder 105 is for example as an error correction code (ECC) encoder. The decoder circuit 110 is for example an ECC decoder. The flash memory 102 includes multiple flash memory chips such as NAND-type flash memory chips. For example, when the host device 101 writes data to one or more flash memory chips in the flash memory 102, the data to be written (for example simply called a write data) will first be sent to the flash memory controller 100. The ECC encoder 105 performs an encoding processing operation (for example, Low-density parity-check code (LDPC) encoding processing, but not limited to) upon the write data to generate an encoded write data, so as to write the encoded write data into one or more flash memory chips of the flash memory 102. In addition, when the host device 101 reads data from one or more flash memory chips in the flash memory 102, the data to be read (for example simply called a read data) will first be sent to the flash memory controller 100. The ECC decoder 110 performs a decoding processing operation (such as LDPC decoding processing, but not limited) upon the read data to generate a decoded read data, so as to transmit the decoded read data into the host device 101. It should be noted that the process of data reading/writing operations may also involve with other data processing operations such as randomization operations and de-randomization operations, etc. The modifications are suitable for the embodiments of the invention.

As shown in FIG. 1, the ECC decoder circuit 110 is, for example, an LDPC decoder circuit and includes a variable node circuit 1105, a variable-to-check (V2C) circuit 1110, a check node circuit 1115, a check-to-variable (C2V) circuit 1120, a syndrome calculation circuit 1125, and two memory macros 1130V and 1130C. Specifically, the value of an input data initially received by the ECC decoder circuit 100 can be regarded as a channel value and can be stored in a channel value memory (not shown in FIG. 1) of ECC decoder circuit 100. In one embodiment, the ECC decoder circuit 100 for example is applied to a storage device, and the value of the received input data is for example the data read from one or more flash memories of the storage device. In another embodiment, the ECC decoder circuit 100 is applied to a communication system, and the value of the received input data is for example the data received from a mobile communication device such as a mobile phone. In addition, the above-mentioned channel value memory can receive and store the value of the input data in the form of a codeword, and the variable node circuit 1105 reads the input data (i.e. the stored codeword) from the channel value memory 1101. In the following paragraphs, the term "channel value" is used to represent a value received by the ECC decoder circuit 100 and stored in the channel value memory 1101.

In the embodiment of the invention, one or more codewords are stored in the channel value memory. The channel value memory outputs a fragment of bits of a codeword for each time, e.g. at every processing time cycle. Each iterative decoding calculation of the LDPC decoding operation is used to sequentially process and perform calculations upon multiple fragment of bits (for example, 10 fragments) of a codeword. The number of the multiple fragments of bits in the default setting corresponds to and is equal to the number of variable nodes which is to be processed and calculated in each iterative decoding calculation, e.g. ten variable nodes. In other words, it is required to use ten processing time units to perform relevant decoding calculations for a codeword having ten fragments of bits.

The following briefly describes the concept of an iterative decoding of an LDPC decoding operation. In an iterative decoding (for example, the n-th iterative decoding, and n is a positive integer), when a specific codeword of input data (i.e. a channel value) is received and buffered from the channel value memory, the variable node circuit 1105 generates (or updates) and outputs a variable-to-check message, which is a probability value and also called as Q value, according to the specific codeword into the V2C circuit 1110, and generates (or updates) and outputs a log-likely ratio (i.e. a posterior probability value) into the syndrome calculation circuit 1125. Then, the V2C circuit 1110 performs a format conversion of variable node to check node so as to convert the variable-to-check message (Q value) from a variable node domain to a check node domain to generate a converted variable-to-check message into the check node circuit 1115. The check node circuit 1115 performs a minimization calculation based on one or more converted variable-to-check messages to generate a check-to-variable message (also called an R value which is another probability value) to the C2V circuit 1120. The C2V circuit 1120 is used to perform a format conversion of check node to variable node so as to convert the check-to-variable message (R value) from a check node domain to a variable node domain to generate a converted check-to-variable message into the variable node circuit 1105. The variable node circuit 1105 can perform a sum calculation based on one or more check-to-variable messages (R values, i.e. probability values) transmitted from the C2V circuit 1120 to generate and update the variable-to-check message (Q value), and can perform another sum calculation based on one or more check-to-variable messages (R values, i.e. probability values) transmitted from the C2V circuit 1120 to generate and update the log-likely ratio. The log-likely ratio serves as the value of the posterior probability and is outputted to the syndrome calculation circuit 1125. The generated and updated posterior probability value can be a positive value or a negative value. The calculation circuit 1125 uses the syndrome positive/negative sign of the generated and updated posterior probability value to make a hard decision to determine whether to flip information ('0' or '1') of one or more bits in the specific codeword. The syndrome calculation circuit 1125 then calculates a syndrome value based on the result of flipped or not yet flipped information of the codeword (that is, an output data (codeword) may have bits flipped or bits not flipped). In this situation, if the calculated syndrome value is zero, then this indicates that a valid codeword is found, and the iterative decoding calculation can be interrupted and the decoding operation is completed.

In practice, the variable node circuit 1105 performs the sum calculation to generate (or update) and output the variable-to-check message (Q value) and the log-likely ratio (i.e. the posterior probability value), and uses and controls the memory macro 1130V to temporarily store one or more data associated with the sum calculation. When the check node circuit 1115 performs the minimization calculation to generate a check-to-variable message (R value), the memory macro 1130C is used and controlled by the check node circuit 1115 to temporarily store one or more data associated with the minimization calculation. The present invention reduces the power consumption of data reading and writing by reducing the frequency (or number of times) of reading and writing at least one memory of the memory macros 1130V and 1130C during the procedure of iterative decoding.

In practice, the memory macro 1130V and the memory macro 1130C are respectively composed of a set of multiple small physical memories. For example, if the system requires a data width of 544 bits and needs to store a total of 512 entries of data, a memory hardware with a depth of 512 bits and a bandwidth of 544 bits will need to be used at the system level to store the information of the 512 entries of data. However, due to the impact of process yield, memory suppliers will limit the depth and bandwidth, so the actual memory bandwidth often cannot meet system-level requirements. For example, for generating a static random access memory (SRAM) with a depth of 512 bits, the SRAM memory actually implemented can only provide a maximum width of 224 bits. Therefore, in the embodiments, either of the memory macro 1130V and the memory macro 1130C is implemented by using multiple small physical SRAM memories to achieve a depth of 512 bits and a bandwidth of 224 bits of a memory hardware. For example, two 512×224 small memories (having the depth of 512 bits and the width of 224 bits) and one 512×96 SRAM small memory (having the depth of 512 bits and the width of 96 bits) are combined to generate the required memory size. At the system level, each small physical memory is treated as a single entity, and from the operation of reading and writing data with the system data length is changed into the operations of controlling and performing data of reading and writing with the bandwidth of a small memory individually, so that, one or some small memories can be prevented from operating at the same time when one or some small memories do not need to be read or written, thereby reducing the number/frequency of data reading and writing.

Figure 2:
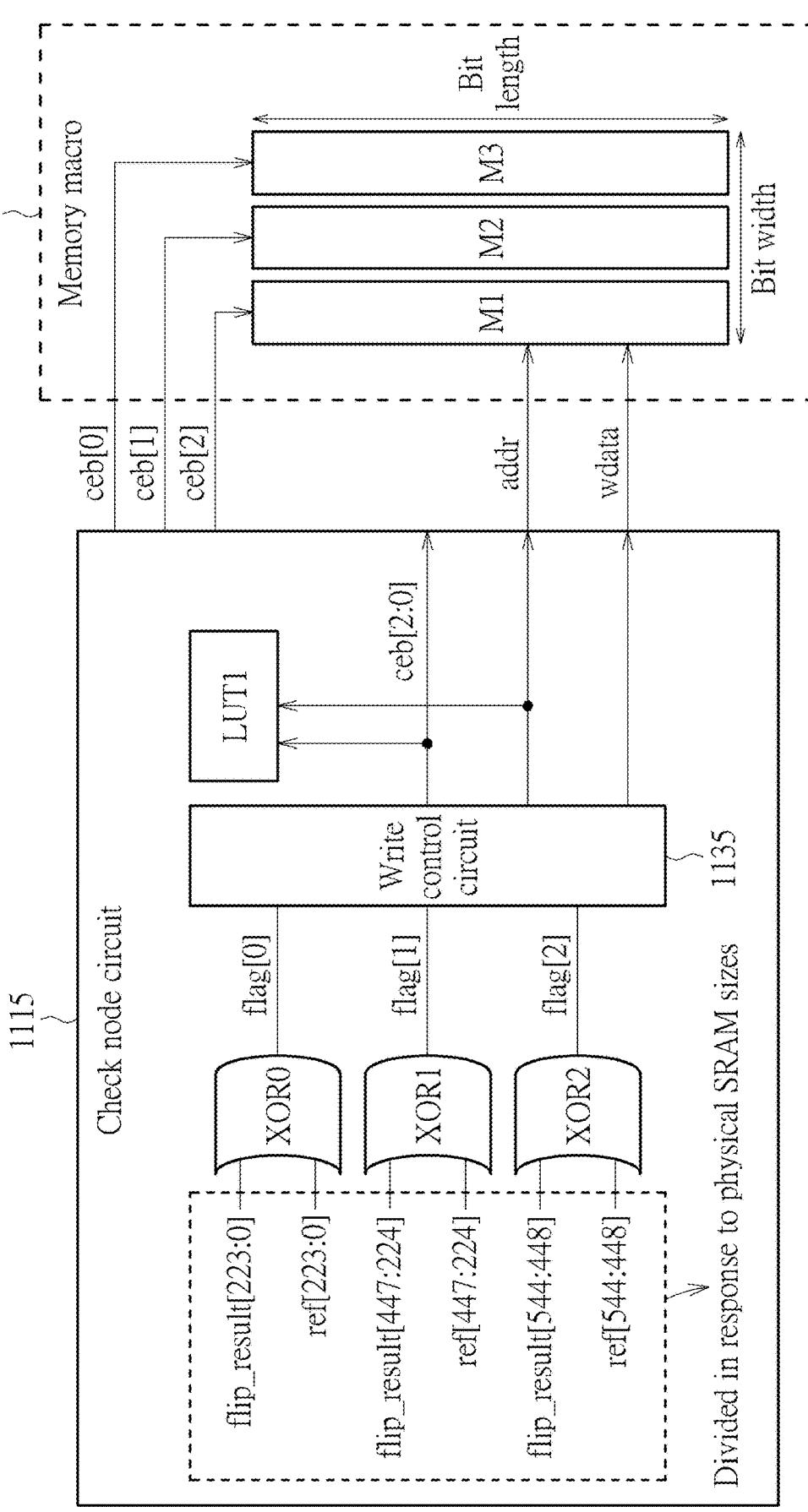
FIG. 2 is a circuit diagram of a check node circuit controlling a memory macro to write data according to an embodiment of the present invention.

Refer to FIG. 2. FIG. 2 is a circuit diagram of the check node circuit 1115 controlling the memory macro 1130C to perform a write operation according to an embodiment of the present invention. As shown in FIG. 2, the memory macro 1130C includes, for example, three (but not limited to) sub-memory units M1, M2, and M3, and the check node circuit 1115 includes a plurality of exclusive-OR gates XOR0, XOR1, XOR2, a write control unit 1135, and a lookup table LUT1. The number of exclusive-OR gates is associated with the number of sub-memory units of the memory macro 1130C, e.g. three (but not limited).

For example, the check node circuit 1115 correspondingly divides a data flip_result[544:0] (the number of bits is not limited), which is to be stored in the memory macro 1130C, into three write data portions flip_result[223:0], flip_result [447:224], and flip_result[544:448], and also divides a reference data ref[544:0] having the same data length into three reference data ref[223:0], ref[447:224], and ref[544:448], respectively uses the three exclusive-OR gates XOR0, XOR1, XOR2 to perform exclusive-OR operations respectively upon the write data portion flip_result[223:0] and reference data ref[223:0], upon the write data portion flip_result[447:224] and reference data ref[447:224], and upon the write data portion flip_result[544:448] and reference data ref[544:448], to respectively perform difference value calculations for the three sets of write data portions and corresponding reference data portions to generate three different difference indication signals flag[0], flag[1], flag [2]. For example, an exclusive-OR operation is performed upon the write data portion flip_result[223:0] and the reference data ref[223:0] to generate a difference indication signal flag[0]. The reference data ref[223:0] is used as a reference value, and can be a starting/initial value (for example, all bits are '0', but not limited) or a known value. The write data portion flip_result[223:0], originally to be stored in the memory macro 1130C, is replaced with the data difference value compared to the reference value. The difference indication signal flag[0] is, for example, implemented in one bit. The exclusive-OR gate XOR0 is, for example, performs exclusive-OR operations sequentially upon corresponding bits of the write data portion flip_result [223:0] and reference data ref[223:0] to perform an OR operation upon the all the results of the exclusive-OR operations to accumulate and generate the difference indication signal flag[0]. In other words, $$\text{flag}[0] = \text{OR}\left(\sum_{i=0}^{MAX} FP[i]\right),$$

wherein FP[i] is a result of an exclusive-OR operation performed upon the (i)-th corresponding bits respectively in the write data portion flip_result[223:0] and reference data ref[223:0]. When the content of the write data portion flip_result[223:0] is different from that of the reference data ref[223:0], that is, a data change occurs, the value of flag[0] is equal to '1'. Alternatively, when no data changes occur, the value of flag[0] is equal to '0' to indicate the content of the write data portion flip_result[223:0] is equal to that of the default reference data ref[223:0]. Similarly, the exclusive-OR gates XOR1 and XOR2 can also perform exclusive-OR operations respectively on their respective write data portions and reference data to generate difference indication signals flag[1] and flag[2], which will not be described again for brevity.

When determining whether to write data into corresponding physical sub-memory(s), the write control circuit 1135 can check whether the data in different segments is changed according to the three difference indication signals flag[0], flag[1] and flag[2]. When the value of a difference indication signal corresponding to a segment (that is, a write data portion) is '0', it indicates that the data of the segment is the same as the default value of reference value, and the write control circuit 1135 in this situation does not perform a write control operation. When the value of the difference indication signal is '1', it indicates that the data in the segment has changed, at this time the write control circuit 1135 performs a write control operation for the data to update the contents stored in the corresponding sub-memory.

In addition, the lookup table LUT1 is, for example, implemented with the same number of registers which are equal to the number of the physical sub-memories, i.e. three registers. The lookup table LUT1 is sued to record whether the positions corresponding to the specific address addr of each sub-memories M1, M2, M3 are written or not. The content recorded in the lookup table LUT1 is used as a reference for reading the data of the specific address addr for next time so as to determine which one or more physical sub-memories' data should be read when reading the data at the specific address addr and to determine which one or more physical sub-memories are not needed to be read.

For example, the write control circuit 1135 can directly use the values of three difference indication signals flag[0], flag[1] and flag[2] to generate three corresponding control bits ceb[2:0] as three sub-memory control signals, namely ceb[0], ceb[1], ceb[2]. The control bits ceb[2:0] will be recorded in the lookup table LUT1. When the value of either one of the controls ceb[0], ceb[1], ceb[2] is '0', this indicates that a corresponding write control operation is not performed. When the value is '1', it means that the write control operation is required. In this way, when the write control circuit 1135 writes the data (i.e. flip_result[544:0] or marked as wdata) of a specific address addr, the write control circuit 1135 can dynamically and individually control the write behaviors and operations of different physical sub-memories M1, M2, and M3 of the memory macro 1130C by using the three sub-memory control signals ceb[0], ceb[1], and ceb[2]. For example, when the value of flag[0] is '1' and both the values of flag[1] and flag[2] are equal to '0', it means that there are two segments in the write data wdata (that is, the write data portions flip_result[447:224] and flip_result[544: 448]) have no data changes occurring between the current time point and the previous time point, so it is not needed to perform write control operations upon the corresponding physical sub-memories M2 and M3 while it is merely required to perform a write control operation upon the physical sub-memory M1 to write the write data portion flip_result[223:0], which including data change(s), into the physical sub-memory M1. In this way, the write control circuit 1135 can configures ceb[0], ceb[1], ceb[2] respectively as '1', '0', and '0' to enable only the writing operation of the physical sub-memory M1 and to close (or disable) the write operations of the physical sub-memories M2 and M3. Compared with the prior art scheme which requires activating the write operations of all the memories each time when writing data at an address, the embodiment of the present invention is to dynamically activates/closes at least one physical sub-memory in the memory macro 1130C, to effectively reduce the memory's writing frequency during the procedure of iterative decoding so that the power consumption of data writing can be further reduced.

Figure 3:
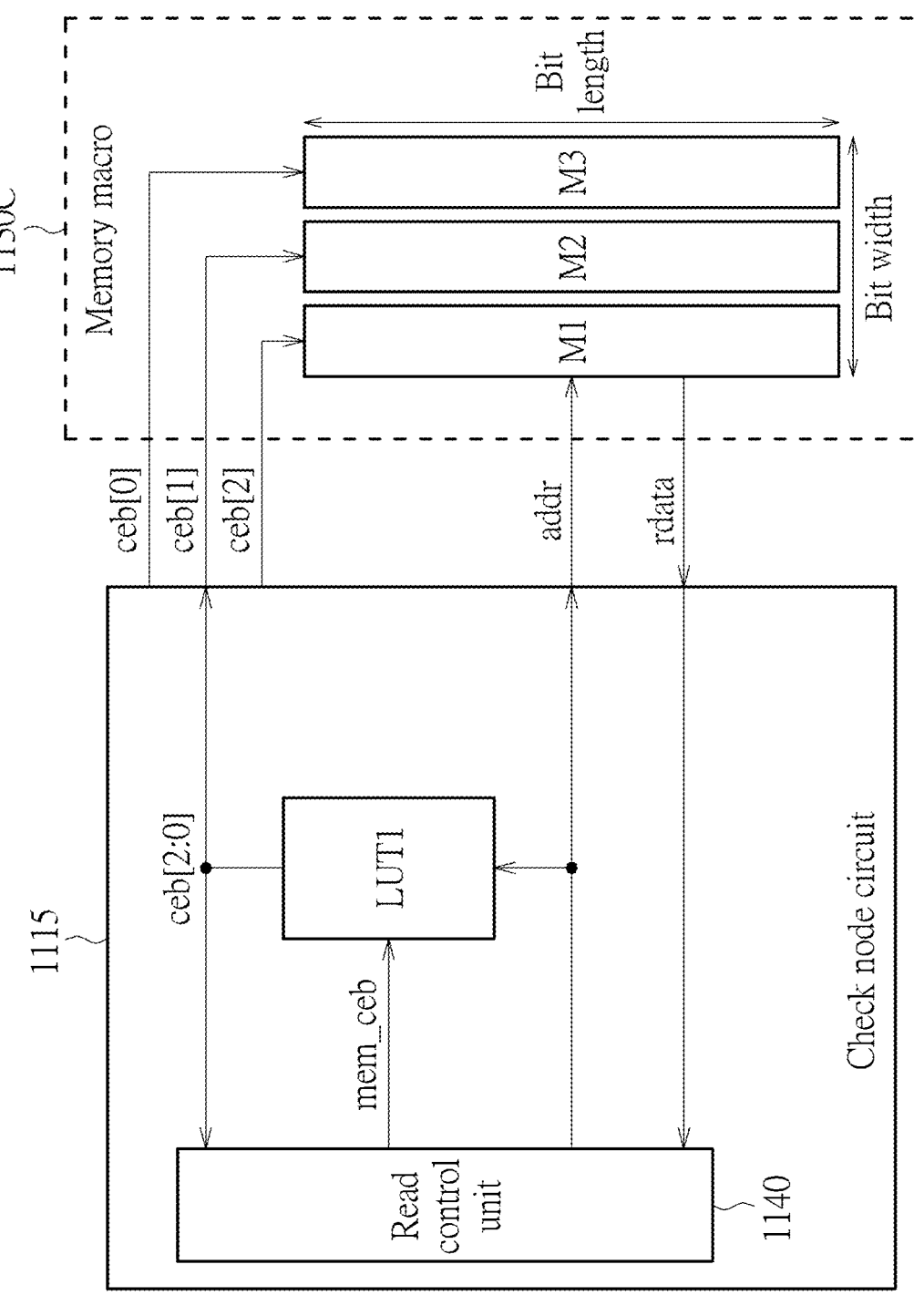
FIG. 3 is a circuit diagram of a check node circuit controlling a memory macro to read data according to an embodiment of the present invention.

Refer to FIG. 3. FIG. 3 is a circuit diagram of the check node circuit 1115 controlling the memory macro 1130C to perform a data read operation according to an embodiment of the present invention. As shown in FIG. 3, the memory macro 1130C includes, for example, three (but not limited to) sub-memory units M1, M2, and M3. The check node circuit 1115 includes, for example, a read control unit 1140 and the above-mentioned Lookup table LUT1.

When the data at a specific address addr is to be read from the memory macro 1130C, the read control unit 1140 sends a read signal Mem_ceb and the specific address addr to the lookup table LUT1 to find the previous memory state (written or not unwritten) corresponding to the specific address addr. According to the previous memory state (written or not unwritten) corresponding to the specific address addr, the read control unit 1140 send the sub-memory control signals ceb[0], ceb[1], ceb[2] to dynamically and individually control the data reading behavior and operations of different physical sub-memories M1, M2, and M3 of the memory macro 1130C. Therefore, when the memory macro 1130C receives the specific address addr and the sub-memory control signals ceb[0], ceb[1], ceb[2], the memory macro 1130C can correspondingly activate or close the operation(s) of physical sub-memory(s) and send the data rdata of the activated physical sub-memory(s) back to the read control unit 1140. For example, when ceb[0], ceb[1], and ceb[2] are set to '1', '0', and '0' respectively, only the read operation of the physical sub-memory M1 is activated, the read operations of physical sub-memories M2 and M3 are closed (disabled). In this situation, the data rdata of the activated physical sub-memory(s) only contains the data stored in the physical sub-memory M1 (which is the data of the first segment of data at the specific address addr). Although the read control unit 1140 will not receive the data of the physical sub-memories M2 and M3, the read control unit 1140 based on the values of ceb[0], ceb[1], ceb[2] can know that no data changes occur in the last two segments of data at the specific address addr. The read control unit 1140 can automatically set the data content of the last two segments as the default value of reference data (for example all bits are '0') for subsequent operations. By doing so, the read control unit 1140 can still correctly generate all the data contents at the specific address addr in the condition of not activating (i.e. disabling) the read operations of physical sub-memories M2 and M3. Compared with the prior art scheme which requires activating all memory read operations every time when data at an address is read, the embodiment of the present invention dynamically activates/ closes at least one physical sub-memory in the memory macro 1130C, and this can effectively reduce the read frequency for the memory during calculations of iterative decoding so that the power consumption can be further reduced.

Figure 4:
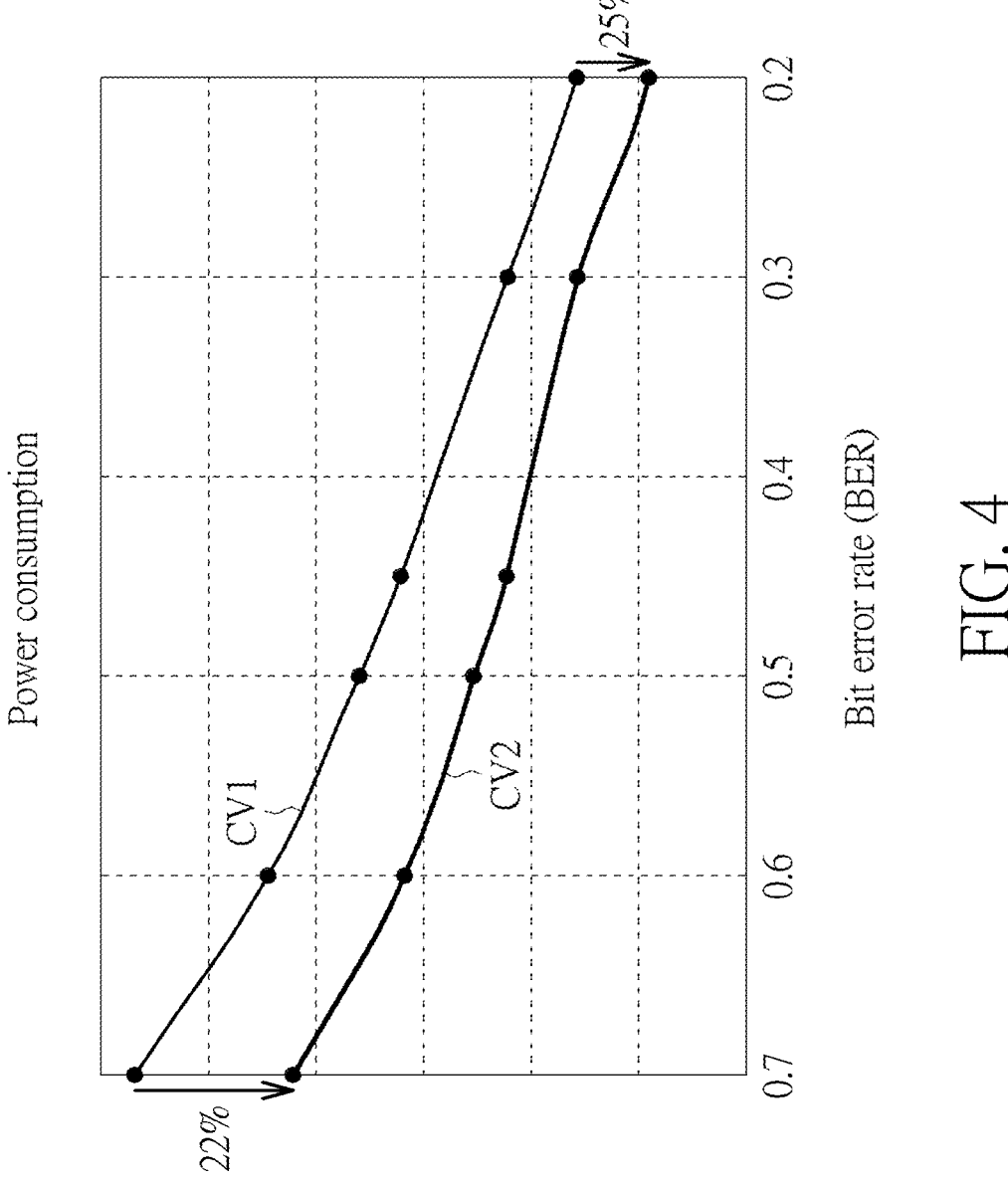
FIG. 4 is a schematic diagram showing the comparison between the performance of the embodiment of the present invention and the prior art method.

Refer to FIG. 4. FIG. 4 is a schematic diagram showing a comparison between the performance of the embodiment of the present invention and the prior art method. As shown in FIG. 4, the horizontal axis represents different bit error rates (BER), and the vertical axis represents power consumption. CV1 represents the power consumption of the conventional scheme while CV2 represents the power consumption required by the embodiment of the invention for dynamically activating/closing the read and write control operations of the physical sub-memory(s) under different conditions of bit error rates. As shown in FIG. 4, compared with the prior art scheme, the embodiment of the invention is able to greatly reduce the required power consumption, e.g. more than 20% power can be saved.

Figure 5:
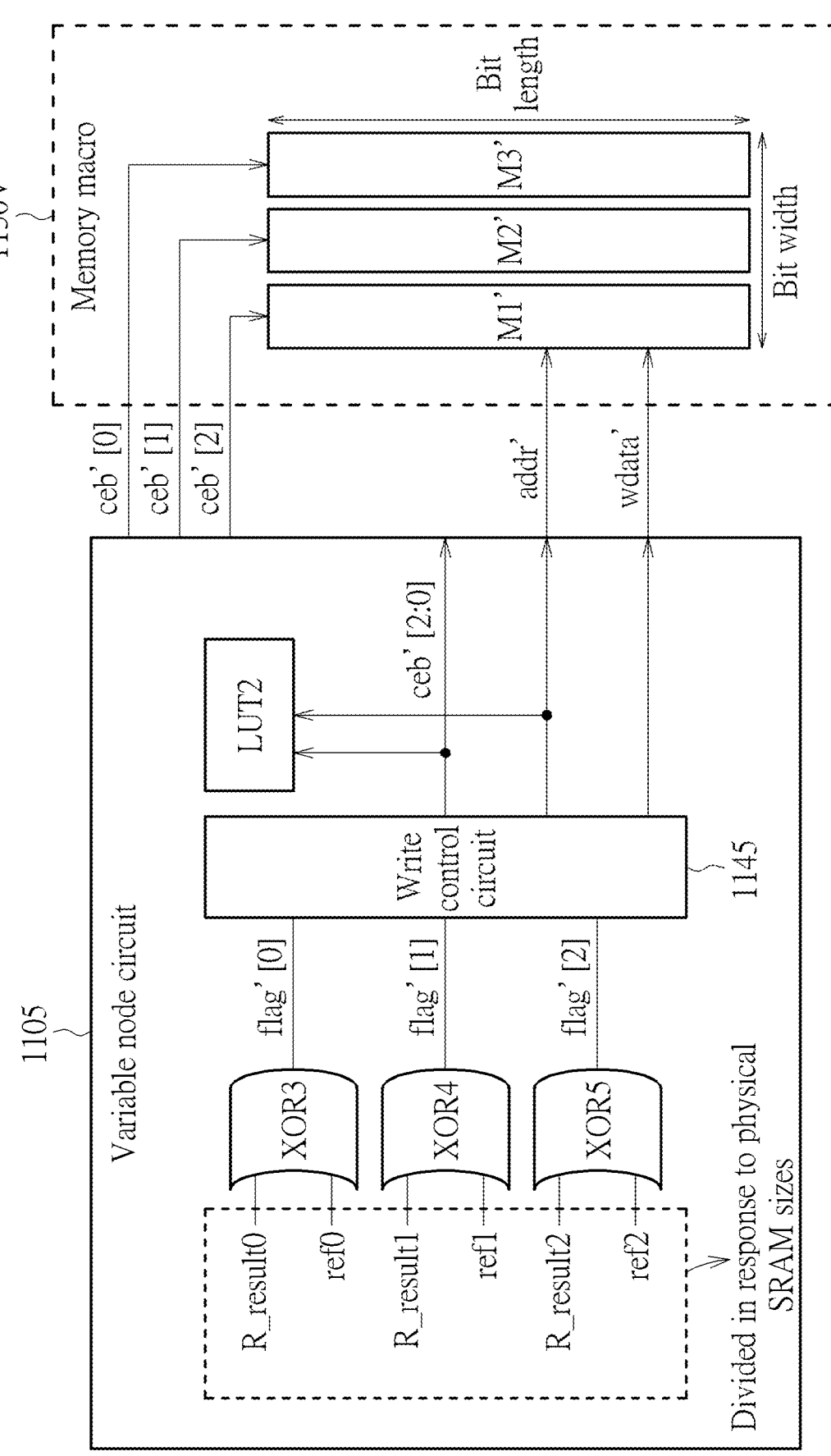
FIG. 5 is a circuit diagram of a variable node circuit controlling a memory macro to write data according to an embodiment of the present invention.
Figure 6:
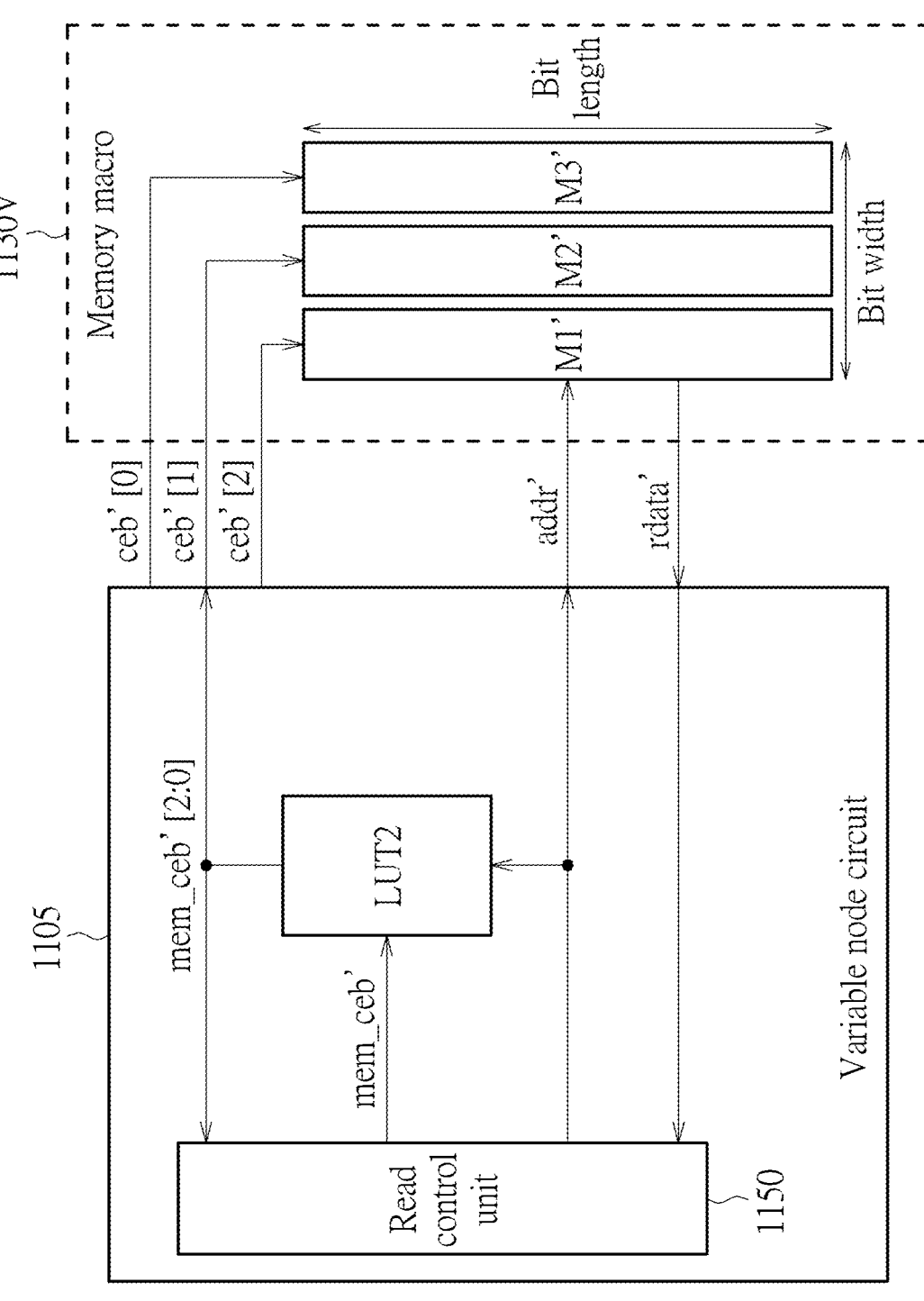
FIG. 6 is a circuit diagram of a variable node circuit controlling a memory macro to read data according to an embodiment of the present invention.

In addition, in other embodiments, the circuit operations and methods of FIG. 2 and FIG. 3 are also applicable to the variable node circuit 1105. Refer to FIG. 5 in conjunction with FIG. 6. FIG. 5 is a circuit diagram of the variable node circuit 1105 controlling the memory macro 1130V to perform a write operation according to an embodiment of the present invention. FIG. 6 is a circuit diagram of the variable node circuit 1105 controlling the memory macro 1130V to read data according to an embodiment of the present invention. As shown in FIG. 5, the memory macro 1130V includes, for example, three (but not limited) sub-memory units M1', M2' and M3', and the variable node circuit 1105 includes a plurality of exclusive-OR gates XOR3, XOR4, XOR5, a write control unit 1145, and a lookup table LUT2. The number of the multiple exclusive-OR gates corresponds to that number of sub-memory units of the memory macro 1130V, e.g. three (but not limited).

For example, the variable node circuit 1105 correspondingly divides a data R_result, to be stored in the memory macro 1130V, into three write data portions R_result0, R_result1, and R_result2, divides a reference data ref having the same data length into three reference data ref0, ref1, and ref2, and respectively uses the three exclusive-OR gates XOR3, XOR4, and XOR5 to respectively perform exclusive-OR operations upon the write data portion R_result0 and reference data ref0, upon the write data portion R_result1 and reference data ref1, and upon the write data portion R_result2 and reference data ref2 to performs the difference value calculations upon the three sets of write data portions and corresponding reference data portions to generate three different difference indication signals flag'[0], flag'[1], and flag'[2]. For example, an exclusive-OR operation is performed upon the write data portion R_result0 and reference data ref0 to generate a difference indication signal flag'[0]. The reference data ref0 is used as a reference value which can be a starting/initial value (for example all bits' 0', but not limited) or a known value. The write data portion R_result0, which is originally to be stored in the memory macro 1130V, is replaced by the data difference value compared to the reference value, and the difference indication signal flag'[0] for example can be implemented with one bit. The exclusive-OR gate XOR3 for example performs exclusive-OR operations sequentially upon the corresponding bits in the write data portion R_result0 and reference data ref0 to finally perform an OR operation upon all the results of exclusive-OR operations to accumulate and generate the difference indication signal; the operations are the same as the method for generating the difference indication signal flag[0] in the previous paragraph and will not be described for brevity. When the content of the write data portion R_result0 is different from the reference data ref0, i.e. a data change occurs, the value of flag'[0] is equal to '1'. When no data changes occur, the value of flag'[0] is equal to '0' to indicate that the content of the write data portion R_result0 is the same as the default value of reference data ref0. Similarly, the exclusive-OR gates XOR4 and XOR5 can also perform exclusive-OR operations respectively their write data portions and reference data to generate difference indication signals flag'[1] and flag'[2], and the detailed operations are not described for brevity.

When determining whether to write data into corresponding physical sub-memory(s), the write control circuit 1145 can check the different segments to determine whether a data change occurs or not according to the three difference indication signals flag'[0], flag'[1], and flag'[2]. When the value of a difference indication signal corresponding to a segment (i.e. a write data portion) is '0', this indicates the data in the segment is the same as a default reference value, and in this situation the write control circuit 1145 will not perform a write control operation. When the value of the difference indication signal is '1', this indicates that a data change occurs in the segment, and in this situation the write control circuit 1145 is used to perform a write control operation to write data so as to update the content stored in a corresponding sub-memory.

In addition, the lookup table LUT2 is, for example, implemented with registers having the number being identical to that of the physical sub-memories, i.e. three registers, and is used to record the written/unwritten states corresponding to the specific addresses addr' of each sub-memories M1', M2', and M3'. The content recorded in the lookup table LUT2 is used as a reference for reading the data at the specific address addr' for next time to determine which one or more physical sub-memories' data should be read out and which one or more physical sub-memories are not needed to be read when reading the data at the specific address addr'.

For example, the write control circuit 1145 can directly use the values of three difference indication signals flag'[0], flag'[1], and flag'[2] to generate three corresponding control bits ceb'[2:0] as three sub-memory control signals ceb'[0], ceb'[1], ceb'[2]. The control bits ceb'[2:0] are recorded in the lookup table LUT2. When the value of any one of control bits ceb'[0], ceb'[1], and ceb'[2] is '0', this means that writing control operation is not performed. When the value is '1', this means that it is needed to perform a write control operation. In this way, when writing data wdata' into a specific address addr', the write control circuit 1145 can use three sub-memory control signals ceb'[0], ceb'[1], ceb'[2] to dynamically and individually control the writing behaviors and operations of different physical sub-memories M1', M2', and M3' of the memory macro 1130V. For example, when the value of flag'[0] is '1' and both the values of flag'[1] and flag'[2] are '0', this indicates that no data changes occur in two segments of the write data wdata' between the current time point and the previous time point, so it is not needed to control the writing of the corresponding physical sub-memories M2' and M3'. It only needs to control the writing of the physical sub-memory M1' to write the data portion R_result0, in which a data change occurs, into the physical sub-memory M1'. Thus, the write control circuit 1145 can respectively set ceb'[0], ceb'[1], and ceb'[2] as '1', '0', and '0' to only activate the write operation of the physical sub-memory M1' and close (disable) the write operations of the physical sub-memories M2' and M3'. Compared with the prior art scheme which requires activating the writing operations of all the memories each time when writing data into an address, the embodiment of the present invention dynamically activates/closes at least one physical sub-memory in the memory macro 1130V to able to effectively reduce the writing frequency of memory during the procedure of iterative decoding so as to further reduce the power consumption of data writing.

In addition, as shown in FIG. 6, the memory macro 1130V includes, for example, three (but not limited to) sub-memory units M1', M2' and M3'. The variable node circuit 1105 includes, for example, a read control unit 1150 and the lookup table LUT2 in FIG. 5. When the data at a specific address addr' is to be read from the memory macro 1130V, the read control unit 1150 sends a read signal Mem_ceb' and the specific address addr' to the lookup table LUT2 to find the previous written/unwritten state corresponding to the specific address addr' of a memory. Based on the previous written/unwritten state, the read control unit 1150 sends the sub-memory control signals ceb'[0], ceb'[1], ceb'[2] to dynamically and individually control the read behaviors and operations of different physical sub-memories M1', M2', and M3' of the memory macro 1130V. Therefore, when the memory macro 1130V receives the specific address addr' and the sub-memory control signals ceb'[0], ceb'[1], ceb'[2], the memory macro 1130V can correspondingly activate or close one or more physical sub-memories and send the data rdata' of the one or more activated physical sub-memories back to the read control unit 1150. For example, when the signals ceb'[0], ceb'[1], and ceb'[2] are set as '1', '0', and '0' respectively, only the read operation of the physical sub-memory M1' will be enabled, and the read operations of the physical sub-memories M2' and M3' are disabled. In this situation, the data rdata' of the activated physical sub-memory contains only the data stored in the physical sub-memory M1' (which is used as the data of the first segment in the data at the specific address addr'). Although the read control unit 1150 will not receive the data of the physical sub-memories M2' and M3', however, the read control unit 1150 based on ceb'[0], ceb'[1], ceb'[2] can know that no data changes occur in the data content of the last two segments of the data at the specific address addr' and thus can automatically set the data contents of the last two segments as the default reference value (for example all bits are '0') for subsequent operations. By doing so, the read control unit 1150 can still correctly generate all contents of the data at the specific address addr' under the coding of not activating (i.e. closing) the physical sub-memories M2' and M3'. Compared with the prior art scheme which requires activating all read operations of all memories every time when data at an address is read, the embodiment of the present invention can dynamically activate or close at least one physical sub-memory in the memory macro 1130V to able to effectively reduce the read frequency of memory during the procedure of iterative decoding so as to further reduce the power consumption.

Figure 7:
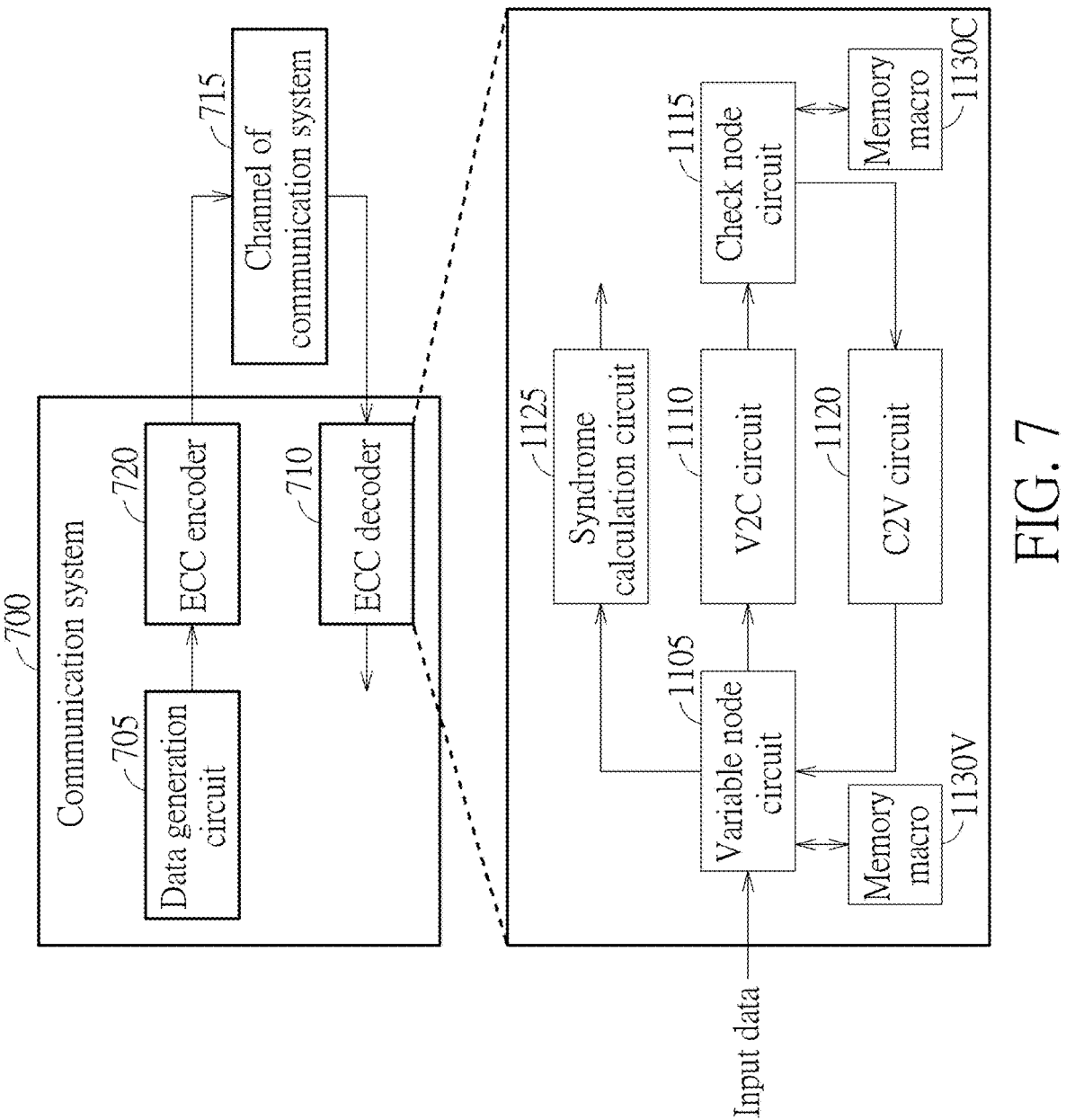
FIG. 7 is a schematic diagram of a communication system circuit according to an embodiment of the present invention.

Similarly, the above-mentioned ECC decoder (or decoder circuit) can also be applied in a communication system. Refer to FIG. 7. FIG. 7 is a schematic diagram of a communication system circuit 700 according to an embodiment of the present invention. As shown in FIG. 7, the communication system circuit 700 is, for example, a wireless transceiver and includes a data generation circuit 705, an ECC encoder 720 and an ECC decoder 710. The data generation circuit 705 is used to generate a specific data such as data of a codeword. The ECC encoder 720 performs ECC encoding (e.g. an LDPC encoding operation) upon the specific codeword to generate an encoded codeword and transmits the encoded codeword to a communication system channel 715 such as a wireless transmission medium (but not limited to). Then the ECC decoder 710 is used to receive the encoded codeword and perform a decoding operation upon the encoded codeword to perform calculations during the procedure of multiple iterative decoding operations to generate a correct codeword data. The ECC decoder 710 is, for example, an LDPC decoder circuit and includes a variable node circuit 1105, a V2C circuit 1110, a check node circuit 1115, a C2V circuit 1120, a syndrome calculation circuit 1125, and two memory macros 1130V and 1130C; the operations and functions are the same as those of the aforementioned components with the same number and will not be repeated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoder circuit, comprising:
a variable node circuit, for receiving a specific codeword of an input data and for generating or updating a variable-to-check message based on data of the specific codeword and generating a log-likely ratio to a syndrome calculation circuit;
a variable-to-check circuit, coupled to the variable node circuit, for converting the variable-to-check message from a variable node domain to a check node domain to generate a converted variable-to-check message;
a check node circuit, coupled to the variable-to-check circuit, for performing a minimization calculation based on the converted variable-to-check message to generate a check-to-variable message;
a check-to-variable circuit, coupled to the check node circuit, for converting the check-to-variable message from the check node domain to the variable node domain to generate a converted check-to-variable message, to make the variable node circuit based on the converted check-to-variable message perform a sum calculation to update the variable-to-check message and perform another sum calculation to update the log-likely ratio;

the syndrome calculation circuit, coupled to the variable node circuit, for performing a hard decision operation based on the log-likely ratio to determine whether to flip information of at least one bit in the specific codeword to generate an output codeword;

a first memory macro having multiple first physical sub-memories, to be read and written and controlled by the check node circuit to perform the minimization calculation; and a second memory macro having multiple second physical sub-memories, to be read and written and controlled by the variable node circuit to perform the sum calculation and the another sum calculation;

wherein the check node circuit performs a difference value calculation upon specific data to be stored in the first memory macro and a reference data to generate a difference value, activates a write operation of a portion of first physical sub-memories in the multiple first physical sub-memories to write the difference value into the portion of first physical sub-memories in the multiple first physical sub-memories, and closes a write operation of another portion of first physical sub-memories in the multiple first physical sub-memories.

2. The decoder circuit of claim 1, wherein the check node circuit comprises:

multiple exclusive-OR gates, for performing multiple exclusive-OR operations respectively upon multiple data portions of the specific data, to be stored into the first memory macro, and multiple data portions of the reference data so as to generate multiple difference indication signals; and a write control circuit, coupled to the multiple exclusive-OR gates, for recording a specific address and multiple control bits in a first lookup table according to information of the multiple difference indication signals;

wherein when a difference indication signal indicates that no data changes occur, the write control circuit uses a control bit corresponding to the difference indication signal to close a write operation at the specific address of a corresponding first physical sub-memory in the first memory macro; and, when another difference indication signal indicates that a data change occurs, the write control circuit uses another control bit corresponding to the another difference indication signal to activate a write operation at the specific address of another corresponding first physical sub-memory in the first memory macro.

3. The decoder circuit of claim 2, wherein the check node circuit comprises:

a read control circuit, coupled to the first lookup table, for reading the multiple control bits temporarily stored in the first lookup table according to the specific address, activating a read operation at the specific address of the another corresponding first physical sub-memory in the first memory macro and closing a read operation at the specific address of the corresponding first physical sub-memory in the first memory macro according to information of the multiple control bits, to read data from the another corresponding first physical sub-memory into the read control circuit as information of another data portion of the specific data.

4. The decoder circuit of claim 3, wherein when the control bit corresponding to the difference indication signal indicates that no data changes occur, the read control circuit configures information of a data portion of the specific data corresponding to the control bit by using a corresponding reference data portion of the reference data.

5. The decoder circuit of claim 1, wherein the variable node circuit performs another difference value calculation upon another specific data, to be stored in the second memory macro, and another reference data to generate another difference value, and activates a write operation of a portion of second physical sub-memories in the multiple second physical sub-memories to write the another difference value into the portion of second physical sub-memories in the multiple second physical sub-memories, and closes a write operation of another portion of second physical sub-memories in the multiple second physical sub-memories.

6. The decoder circuit of claim 5, wherein the variable node circuit comprises:

multiple exclusive-OR gates, for performing multiple exclusive-OR operations respectively upon multiple data portions of the another specific data, to be stored into the second memory macro, and multiple reference data portions of the another reference data to generate multiple difference indication signals; and a write control circuit, coupled to the multiple exclusive-OR gates, for recording a specific address and multiple control bits in a second lookup table according to information of the multiple difference indication signals;

wherein when a difference indication signal indicates that no data changes occur, the write control circuit uses a control bit corresponding to the difference indication signal to close a write operation at the specific address of a corresponding second physical sub-memory in the second memory macro; and, when another difference indication signal indicates that a data change occurs, the write control circuit uses another control bit corresponding to the another difference indication signal to activate a write operation at the specific address of another corresponding second physical sub-memory in the second memory macro.

7. The decoder circuit of claim 6, wherein the variable node circuit comprises:

a read control circuit, coupled to the second lookup table, for reading out the multiple control bits temporarily stored in the second lookup table according to the specific address, activating a read operation at the specific address of the another corresponding second physical sub-memory in the second memory macro and closing a read operation at the specific address of corresponding second physical sub-memory in the second memory macro according to information of the multiple control bits, to read out data of the another corresponding second physical sub-memory into the read control circuit and to be used as information of another data portion of the another specific data.

8. The decoder circuit of claim 7, wherein when the control bit corresponding to the difference indication signal indicates that no data changes occur, the read control circuit is to configure information of a data portion of the another specific data corresponding to the control bit by using a corresponding reference data portion of the another reference data.

9. The decoder circuit of claim 1 being used and comprised in a flash memory controller.

10. A decoding method of a decoder circuit, comprising:

using a variable node circuit to receive a specific codeword of an input data and generate or update a variableto-check message based on data of the specific codeword and generate a log-likely ratio to a syndrome calculation circuit;

converting the variable-to-check message from a variable node domain to a check node domain to generate a converted variable-to-check message;

using a check node circuit to perform a minimization calculation based on the converted variable-to-check message to generate a check-to-variable message;

converting the check-to-variable message from the check node domain to the variable node domain to generate a converted check-to-variable message;

performing a sum calculation to update the variable-to-check message based on the converted check-to-variable message and performing another sum calculation to update the log-likely ratio;

performing a hard decision operation based on the log-likely ratio to determine whether to flip information of at least one bit in the specific codeword to generate an output codeword;

providing a first memory macro having multiple first physical sub-memories, to be read and written and controlled by the check node circuit to perform the minimization calculation;

providing a second memory macro having multiple second physical sub-memories, to be read and written and controlled by the variable node circuit to perform the sum calculation and the another sum calculation; and performing a difference value calculation upon specific data to be stored in the first memory macro and a reference data to generate a difference value, activating a write operation of a portion of first physical sub-memories in the multiple first physical sub-memories to write the difference value into the portion of first physical sub-memories in the multiple first physical sub-memories, and closing a write operation of another portion of first physical sub-memories in the multiple first physical sub-memories.

11. The decoding method of claim 10, further comprising:

performing multiple exclusive-OR operations respectively upon multiple data portions of the specific data, to be stored into the first memory macro, and multiple data portions of the reference data to generate multiple difference indication signals; and recording a specific address and multiple control bits in a first lookup table according to information of the multiple difference indication signals;

when a difference indication signal indicates that no data changes occur, using a control bit corresponding to the difference indication signal to close a write operation at the specific address of a corresponding first physical sub-memory in the first memory macro; and when another difference indication signal indicates that a data change occurs, using another control bit corresponding to the another difference indication signal to activate a write operation at the specific address of another corresponding first physical sub-memory in the first memory macro.

12. The decoding method of claim 11, further comprising:

reading the multiple control bits temporarily stored in the first lookup table according to the specific address; and activating a read operation at the specific address of the another corresponding first physical sub-memory in the first memory macro and closing a read operation at the specific address of the corresponding first physical sub-memory in the first memory macro according to information of the multiple control bits, to read data from the another corresponding first physical sub-memory into the read control circuit as information of another data portion of the specific data.

13. The decoding method of claim 12, further comprising:

when the control bit corresponding to the difference indication signal indicates that no data changes occur, configuring information of a data portion of the specific data corresponding to the control bit by using a corresponding reference data portion of the reference data.

14. The decoding method of claim 10, further comprising:

performing another difference value calculation upon another specific data, to be stored in the second memory macro, and another reference data to generate another difference value;

activating a write operation of a portion of second physical sub-memories in the multiple second physical sub-memories to write the another difference value into the portion of second physical sub-memories in the multiple second physical sub-memories; and closing a write operation of another portion of second physical sub-memories in the multiple second physical sub-memories.

15. The decoding method of claim 14, further comprising:

performing multiple exclusive-OR operations respectively upon multiple data portions of the another specific data, to be stored into the second memory macro, and multiple reference data portions of the another reference data to generate multiple difference indication signals;

recording a specific address and multiple control bits in a second lookup table according to information of the multiple difference indication signals;

when a difference indication signal indicates that no data changes occur, using a control bit corresponding to the difference indication signal to close a write operation at the specific address of a corresponding second physical sub-memory in the second memory macro; and when another difference indication signal indicates that a data change occurs, using another control bit corresponding to the another difference indication signal to activate a write operation at the specific address of another corresponding second physical sub-memory in the second memory macro.

16. The decoding method of claim 15, further comprising:

reading out the multiple control bits temporarily stored in the second lookup table according to the specific address; and activating a read operation at the specific address of the another corresponding second physical sub-memory in the second memory macro and closing a read operation at the specific address of corresponding second physical sub-memory in the second memory macro according to information of the multiple control bits, to read out data of the another corresponding second physical sub-memory into the read control circuit and to be used as information of another data portion of the another specific data.

17. The decoding method of claim 16, further comprising:

when the control bit corresponding to the difference indication signal indicates that no data changes occur, configuring information of a data portion of the another specific data corresponding to the control bit by using a corresponding reference data portion of the another reference data.

18. A flash memory controller, comprising:

an encoder, for performing an encoding operation upon a write data sent from a host device to write the write data into a flash memory; and a decoder circuit, for performing a decoding operation upon a read data read from the flash memory to generate a decoded data, and the decoder circuit comprises:

a variable node circuit, for receiving a specific codeword of the read data and for generating or updating a variable-to-check message based on data of the specific codeword and generating a log-likely ratio to a syndrome calculation circuit;

a variable-to-check circuit, coupled to the variable node circuit, for converting the variable-to-check message from a variable node domain to a check node domain to generate a converted variable-to-check message;

a check node circuit, coupled to the variable-to-check circuit, for performing a minimization calculation based on the converted variable-to-check message to generate a check-to-variable message;

a check-to-variable circuit, coupled to the check node circuit, for converting the check-to-variable message from the check node domain to the variable node domain to generate a converted check-to-variable message, to make the variable node circuit based on the converted check-to-variable message perform a sum calculation to update the variable-to-check message and perform another sum calculation to update the log-likely ratio;

the syndrome calculation circuit, coupled to the variable node circuit, for performing a hard decision operation based on the log-likely ratio to determine whether to flip information of at least one bit in the specific codeword to generate an output codeword;

a first memory macro having multiple first physical sub-memories, to be read and written and controlled by the check node circuit to perform the minimization calculation; and a second memory macro having multiple second physical sub-memories, to be read and written and controlled by the variable node circuit to perform the sum calculation and the another sum calculation;

wherein the check node circuit performs a difference value calculation upon specific data to be stored in the first memory macro and a reference data to generate a difference value, activates a write operation of a portion of first physical sub-memories in the multiple first physical sub-memories to write the difference value into the portion of first physical sub-memories in the multiple first physical sub-memories, and closes a write operation of another portion of first physical sub-memories in the multiple first physical sub-memories.

* * * * *